United States Patent [19]

Anderson et al.

[11] Patent Number: 5,680,070

[45] Date of Patent: Oct. 21, 1997

[54] PROGRAMMABLE ANALOG ARRAY AND METHOD FOR CONFIGURING THE SAME

[75] Inventors: David J. Anderson, Scottsdale; Douglas A. Garrity, Gilbert, both of Ariz.

[73] Assignee: Motorola, Inc., Schaumburg, Ill.

[21] Appl. No.: 596,803

[22] Filed: Feb. 5, 1996

[51] Int. Cl.⁶ ................................................ H03K 5/24
[52] U.S. Cl. .................... 327/336; 327/337; 327/560; 327/355; 327/345; 327/358; 327/359; 327/351
[58] Field of Search ............................ 327/62, 382, 336, 327/337, 560, 355, 345, 358, 359, 351; 365/48, 189.01

[56] References Cited

U.S. PATENT DOCUMENTS 4,642,487  2/1987  Carter .
5,196,740  3/1993  Austin .
5,408,194  4/1995  Steinbach et al. ............... 327/62
5,493,246  2/1996  Anderson ........................ 327/382

*Primary Examiner*—Viet Q. Nguyen
*Attorney, Agent, or Firm*—Ziye Zhou; Rennie William Dover

[57] ABSTRACT

A programmable analog array (10) comprises an array (11) of cells, each cell including analog circuitry (12), a switch control circuit (18), and a digital storage element (16). The switch control circuit (18) receives a clock signal and sequentially configures the circuits within the analog circuitry (12) to realize different circuit functions in accordance with configuration data stored in different digital memory units (17A–17D) within digital storage element (16). During a time interval, the analog signals generated by the analog circuitry (12) before that time interval are stored in an analog storage element (14), which is constructed from a portion of a capacitor network (54) in the analog circuitry (12) and is partitioned into a set of analog memory units (56A–56D). Each analog memory unit (56A–56D) stores the analog signal for a corresponding phase of the clock signal.

20 Claims, 5 Drawing Sheets

PROGRAMMABLE ANALOG ARRAY AND METHOD FOR CONFIGURING THE SAME

BACKGROUND OF THE INVENTION

The present invention relates, in general, to semiconductor integrated circuits and, more particularly, to semiconductor integrated circuits which are configurable into functionally different circuits.

Integrated circuits are popular in electronics applications because they are more compact and reliable than discrete components mounted on printed circuit boards. Many integrated circuits are designed and manufactured exclusively for particular applications. The process of designing a new integrated circuit and implementing a new design in wafer production is usually very costly.

One approach for reducing cost is to monolithically fabricate a semiconductor integrated circuit which can be configured into functionally different circuits. One such integrated circuit comprises an array of configurable analog cells, wherein each cell is capable of being internally configured and interconnected with other cells in the array. In one approach, a switched capacitor technology is used to implement the configurable analog cells. The array can be used to implement functionally different circuits by means of different internal configurations of cells in the array and different interconnections among the cells in the array.

In order to increase the functional variety of the array, the number of cells in the array can be increased. Alternatively, the functionality of the cells in the array can be increased by adding more circuitry. However, both approaches increase the silicon area of the semiconductor chip, thereby increasing the manufacturing cost of the semiconductor chip.

Accordingly, it would be advantageous to have a programmable analog array and a method for dynamically configuring the programmable analog array to increase the functionality of the programmable analog array without increasing the size of the array. It would be of further advantage for each cell in the array to be simple, thereby reducing the size and manufacturing cost of the semiconductor chip.

DETAILED DESCRIPTION OF THE DRAWINGS

Figure 1:
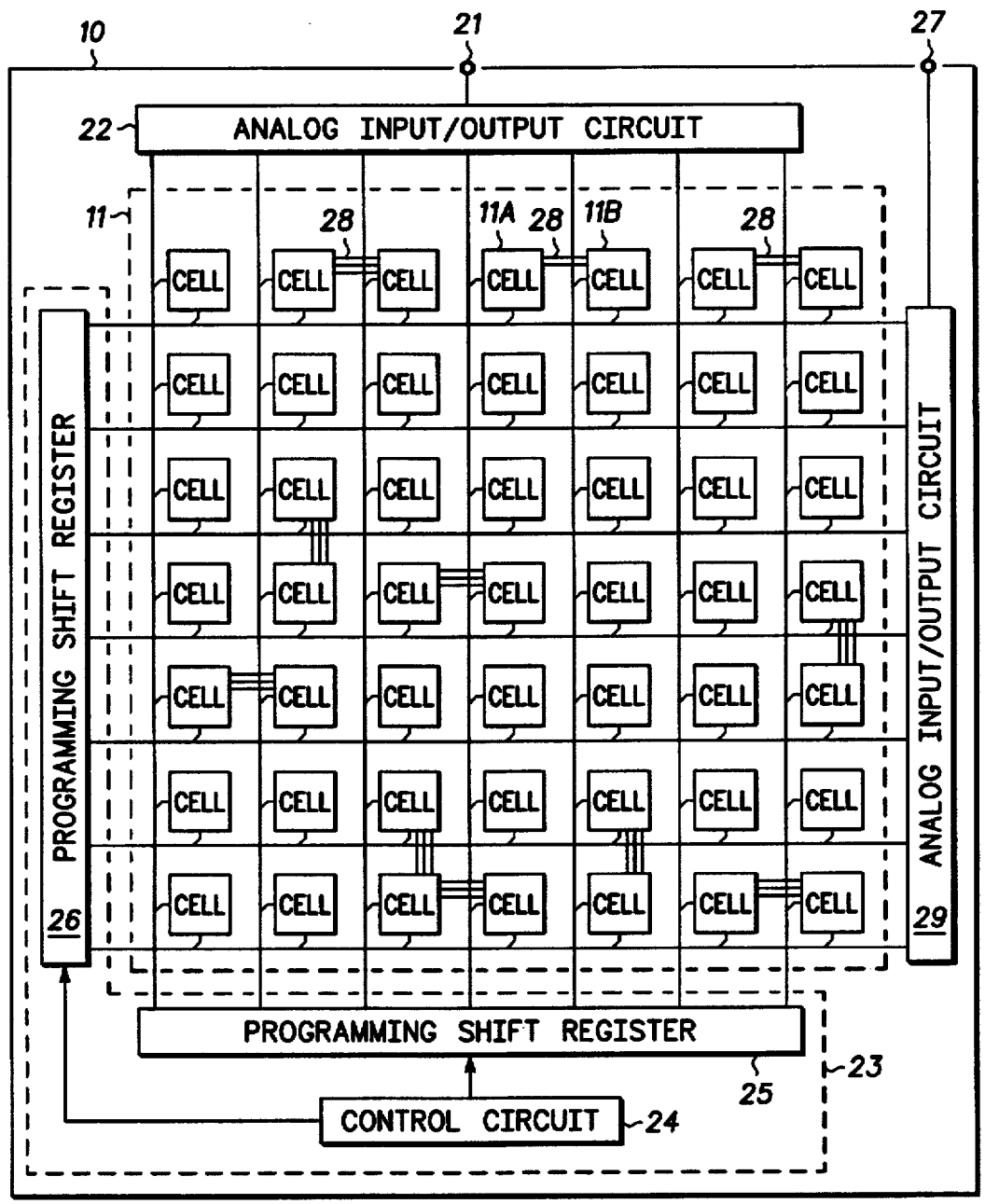
FIG. 1 is a block diagram of a programmable analog array in a representative arrangement in accordance with an embodiment of the present invention.

FIG. 1 is a block diagram of a programmable analog array 10 in a representative arrangement in accordance with an embodiment of the present invention. Programmable analog array 10 can be used to implement a variety of circuits such as amplifiers, filters, rectifiers, oscillators, etc. Programmable analog array 10 comprises an array 11 of cells arranged in seven rows and seven columns. A cell in array 11 contains analog circuitry, a switch control circuit, and a digital storage element, and will be further described with reference to FIG. 2. The analog circuitry in a cell in array 11 includes components such as transistors, resistors, capacitors, and can be configured to implement a plurality of circuit functions. A circuit function refers to the functionality of a circuit. For example, the analog circuitry can be configured as a filter, a gain stage, etc. To realize a circuit having a particular functionality, the switch control circuit in a cell configures the analog circuitry in accordance with cell configuration data stored in the digital storage element of the cell. Configuring the analog circuitry includes coupling various components of the analog circuitry to each other and assigning values to these components, which values are referred to as component values. Examples Of component values include the capacitance value of a capacitor network, the gain of an amplifier, the intrinsic frequency of an oscillator, etc.

Programmable analog array 10 also includes an access circuit 23 for selecting and accessing cells in array 11. Access circuit 23 includes a control circuit 24 and programming shift registers 25 and 26. Control circuit 24 receives cell configuration data for configuring cells in array 11 and interconnection data for interconnecting different cells in array 11 from an external source (not shown in FIG. 1). Programming shift registers 25 and 26 are controlled by control circuit 24. Programming shift register 25 provides a column coordinate reference signal and programming shift register 26 provides a row coordinate reference signal. The column and row coordinate reference signals allow any cell in array 11 to be selected or accessed. After a cell 11A in array 11 is selected, the cell configuration data for cell 11A is transmitted to the digital storage element (not shown in FIG. 1) in cell 11A via access circuit 23.

Interconnection network 28 interconnects different cells in array 11 in accordance with the interconnection data. Interconnection network 28 may include an interconnection network combined with switches to couple different cells in array 11 together in accordance with the interconnection data.

Programmable analog array 10 further includes analog input/output circuits 22 and 29. Analog input/output circuits 22 and 29 transmit analog signals between programmable analog array 10 and external circuitry (not shown in FIG. 1) via analog input/output ports 21 and 27, respectively.

Although array 11 is shown in FIG. 1 as having forty-nine cells arranged in seven rows and seven columns, this is not intended as a limitation of the present invention. Array 11 may include any number of cells, which are arranged in any number of rows and any number of columns, e.g., sixty-four cells arranged in eight rows and eight columns, twenty cells arranged in four rows and five columns, etc., depending on the desired application of programmable analog array 10. In addition, it should be understood that the cells in array 11 are not limited to being identical to each other in the present invention. In other words, array 11 may include cells which are structurally different from one another. For example, cells in the first, third, fifth, and seventh columns may be structurally identical to each other, whereas cells in the second, fourth, and sixth columns may be structurally identical to each other but structurally different from the cells in the first, third, fifth, and seventh columns.

Figure 2:
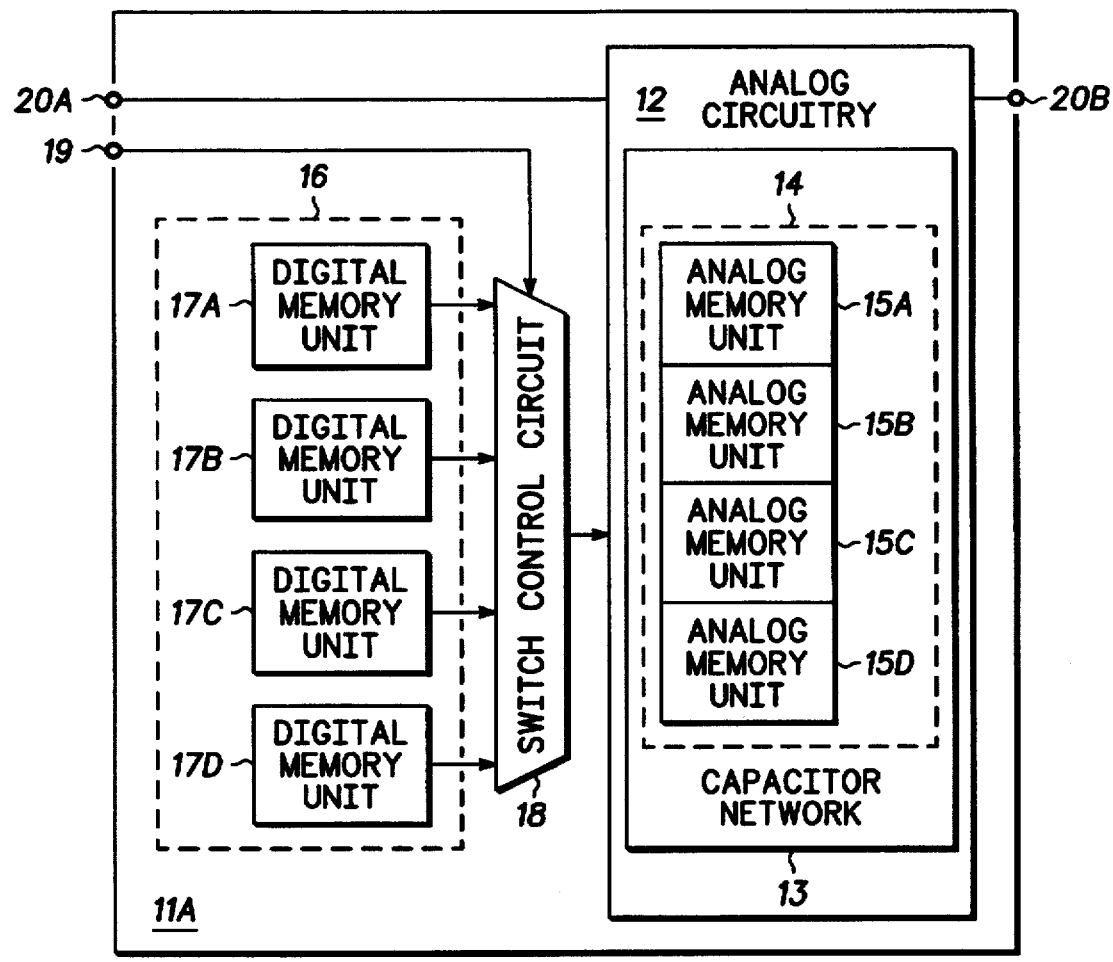
FIG. 2 is a block diagram of a cell in the programmable analog array of FIG. 1.

FIG. 2 is a block diagram of a cell 11A in array 11 of FIG. 1. Cell 11A can be any cell in array 11. Cell 11A includes analog circuitry 12, a switch control circuit 18, and a digital storage element 16. Analog circuitry 12 may include an amplifier, a comparator, and an analog circuit element. The analog circuit element includes internal components, e.g., a capacitor network, with variable connections. In addition, an analog storage element 14 may be formed using a capacitor network 13 which is in analog circuitry 12. Nodes 20A and 20B are coupled to other cells in array 11 via interconnection network 28 of programmable analog array 10 as shown in FIG. 1. It should be understood that cell 11A is not limited to being coupled to other cells in array 11 via two nodes as shown in FIG. 2. Depending on the desired application of programmable analog array 10, cell 11A may include any number of nodes which are coupled to other cells in array 11 for transmitting analog signals.

Digital storage element 16 receives the cell configuration data via programming shift registers 25 and 26 of programmable analog array 10 shown in FIG. 1. The cell configuration data stored in digital storage element 16 includes data for configuring analog circuitry 12 of cell 11A to realize a set of circuit functions. In accordance with the example shown in FIG. 2, digital storage element 16 is partitioned into four digital memory units 17A, 17B, 17C, and 17D. Each digital memory unit 17A–17D in digital storage element 16 stores the cell configuration data for a corresponding circuit function. It should be understood that, in the present invention, digital storage element 16 is not limited to being partitioned into four digital memory units as shown in FIG. 2. Digital storage element 16 may be partitioned into any number of digital memory units, e.g., two, three, five, six, etc., depending on the desired application of programmable analog array 10.

Switch control circuit 18 receives a clock signal via a node 19 and periodically configures analog circuitry 12 to implement a set of circuit functions in accordance with the cell configuration data stored in digital storage element 16. Upon receiving each phase of the clock signal, switch control circuit 18 configures the circuits within analog circuitry 12 to realize a circuit function selected from the set of circuit functions corresponding to that particular phase of the clock signal. In accordance with the example shown in FIG. 2, switch control circuit 18 receives a clock signal having four phases. Upon receiving the first, second, third, and fourth phases, switch control circuit 18 configures analog circuitry 12 in accordance with the cell configuration data stored in digital memory units 17A, 17B, 17C, and 17D, respectively. Therefore, analog circuitry 12 may be configured into as many functionally different circuits as the number of phases of the clock signal.

When the analog circuitry 12 is configured to realize a particular circuit function during a phase of the clock signal, an analog signal such as a voltage generated by the analog circuitry 12 during a previous phase of the clock signal is stored in analog storage element 14. Analog storage element 14 is partitioned into a set of analog memory units. Each analog memory unit in analog storage element 14 stores the analog signal generated by analog circuitry 12 during a corresponding phase of the clock signal. In accordance with the example shown in FIG. 2, analog storage element 14 is partitioned into four analog memory units 15A, 15B, 15C, and 15D. Each analog memory unit 15A–15D in analog storage element 14 is constructed from a portion of a capacitor network 13 in analog circuitry 12. Therefore, capacitor network 13 in analog circuitry 12 is partitioned into a plurality of sections, and each analog memory unit 15A–15D corresponds to a section in capacitor network 13. A method for partitioning a capacitor network into a plurality of sections is discussed infra with reference to FIGS. 3 and 4. By constructing analog storage element 14 from a capacitor network in analog circuitry 12, the silicon area of programmable analog array 10 can be minimized.

It should be understood that, in the present invention, analog storage element 14 is not limited to being constructed from a capacitor network in analog circuitry 12. Each analog memory unit in analog storage element 14 may be constructed from an individual capacitor in cell 11A. It should also be understood that analog circuitry 12 and analog storage element 14 are not limited to being included in the same cell in array 11. For example, analog signals generated by analog circuitry 12 in cell 11A may be stored in an analog storage element in another cell in array 11.

Figure 3:
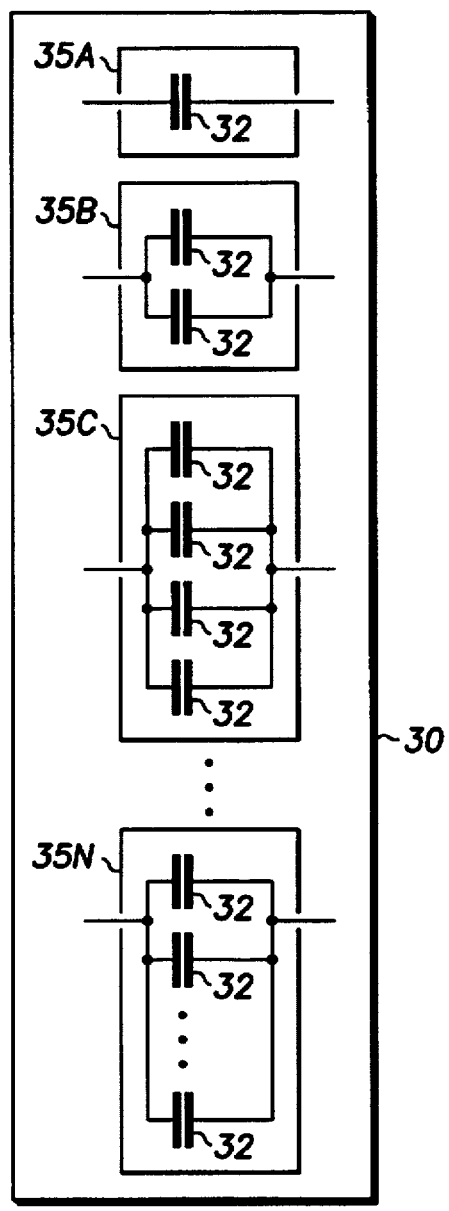
FIG. 3 is a schematic diagram of a capacitor network addressed through a binary number in the cell of FIG. 2.

FIG. 3 is a schematic diagram of a capacitor network 30 that is a portion of analog circuitry 12 of cell 11A shown in FIG. 2. Capacitor network 30 is comprised of a plurality of unit capacitors 32, which are grouped into groups 35A, 35B, 35C, ..., 35N. Groups 35A–35N are addressed by means of a binary number B. In order to address each group 35A–35N in capacitor network 30, the number of bits in binary number B is equal to or greater than the number of groups in capacitor network 30. The capacitance of capacitor network 30 is set in accordance with the particular groups 35A–35N selected form capacitor network 30 by means of binary number B.

In an example, capacitor network 30 includes 256 unit capacitors 32, which are grouped into eight groups 35A–35N. Groups 35A–35N are addressed by means of an eight bit binary number B. As those skilled in the art are aware, an eight bit binary number B is expressed as ($b_7$, $b_6$, $b_5$, $b_4$, $b_3$, $b_2$, $b_1$, $b_0$). A representative group 35A–35N in capacitor network 30 includes $2^n$ unit capacitors and is addressed via bit $b_n$ of eight bit binary number B, where n is an integer ranging from zero to seven. Thus, the first group includes one unit capacitor and is addressed via bit $b_0$ of binary number B. Similarly, the sixth group includes thirty-two unit capacitors and is addressed via bit $b_5$ of binary number B. If each unit capacitor 32 has a capacitance of one pico-Farad, the capacitance of capacitor network 30 is equal to thirty-six pico-Farads when addressed by a binary number expressed as (00100100).

Using capacitor network 30 to form a plurality of analog memory units in analog storage element 14 of FIG. 2 often calls for more flexible addressing of capacitor network 30 than that described with reference to FIG. 3. More particularly, capacitor network 30 is preferably partitioned into as many sections as the number of analog memory units in analog storage element 14 of FIG. 2.

Figure 4:
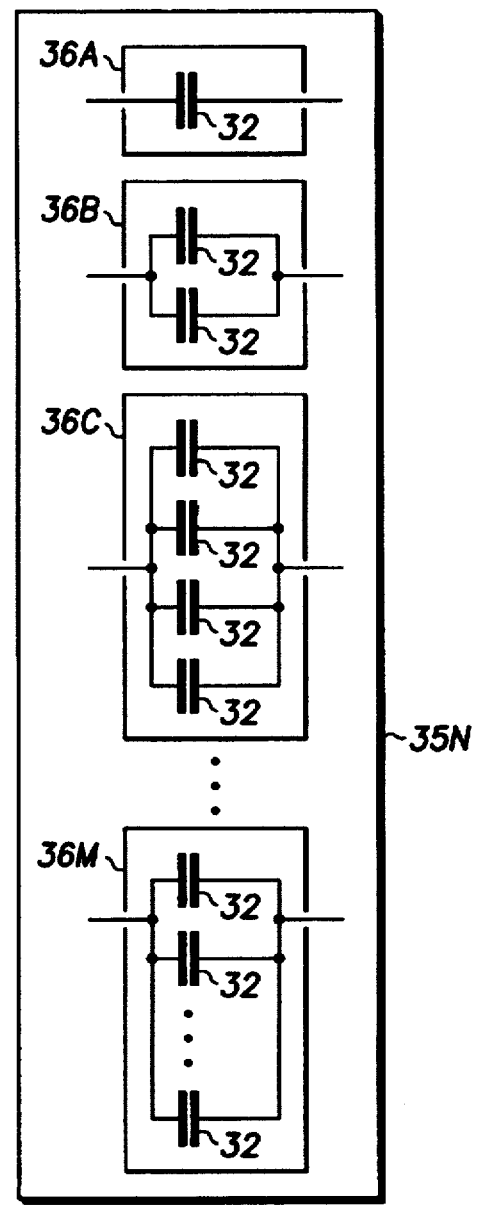
FIG. 4 is a schematic diagram of a section of the capacitor network of FIG. 3 addressed by the most significant bit of the binary number.

First, capacitor network 30 is partitioned into two sections. The first section includes the first seven groups in capacitor network 30. These seven groups are addressed via bit $b_m$, where m is an integer ranging from zero to six. The second section includes the eighth group 35N in capacitor network 30 addressed via the most significant bit $b_7$ of binary number B. Referring to FIG. 4, which is a schematic diagram of the second section in capacitor network 30 of FIG. 3, the second section of capacitor network 30 is partitioned into seven groups and addressed via a seven bit binary number C expressed as ($c_6$, $c_5$, $c_4$, $c_3$, $c_2$, $c_1$, $c_0$). Unit capacitors 32 in the second section are grouped into seven groups, which are designated as 36A, 36B, 36C, ..., 36M. A representative group 36A–36M in the second section of capacitor network 30 includes $2^m$ unit capacitors and is addressed via bit $c_m$ of seven bit binary number C, where m is an integer ranging from zero to six. Therefore, unit capacitors 32 in capacitor network 30 can be either arranged in one section and addressed via bits $b_7$–$b_0$, or arranged in two sections and addressed via bits $b_6$–$b_0$ and $c_6$–$c_0$. This technique can be applied recursively to partition the unit capacitors in capacitor network 30 into four or more sections.

Figure 5:
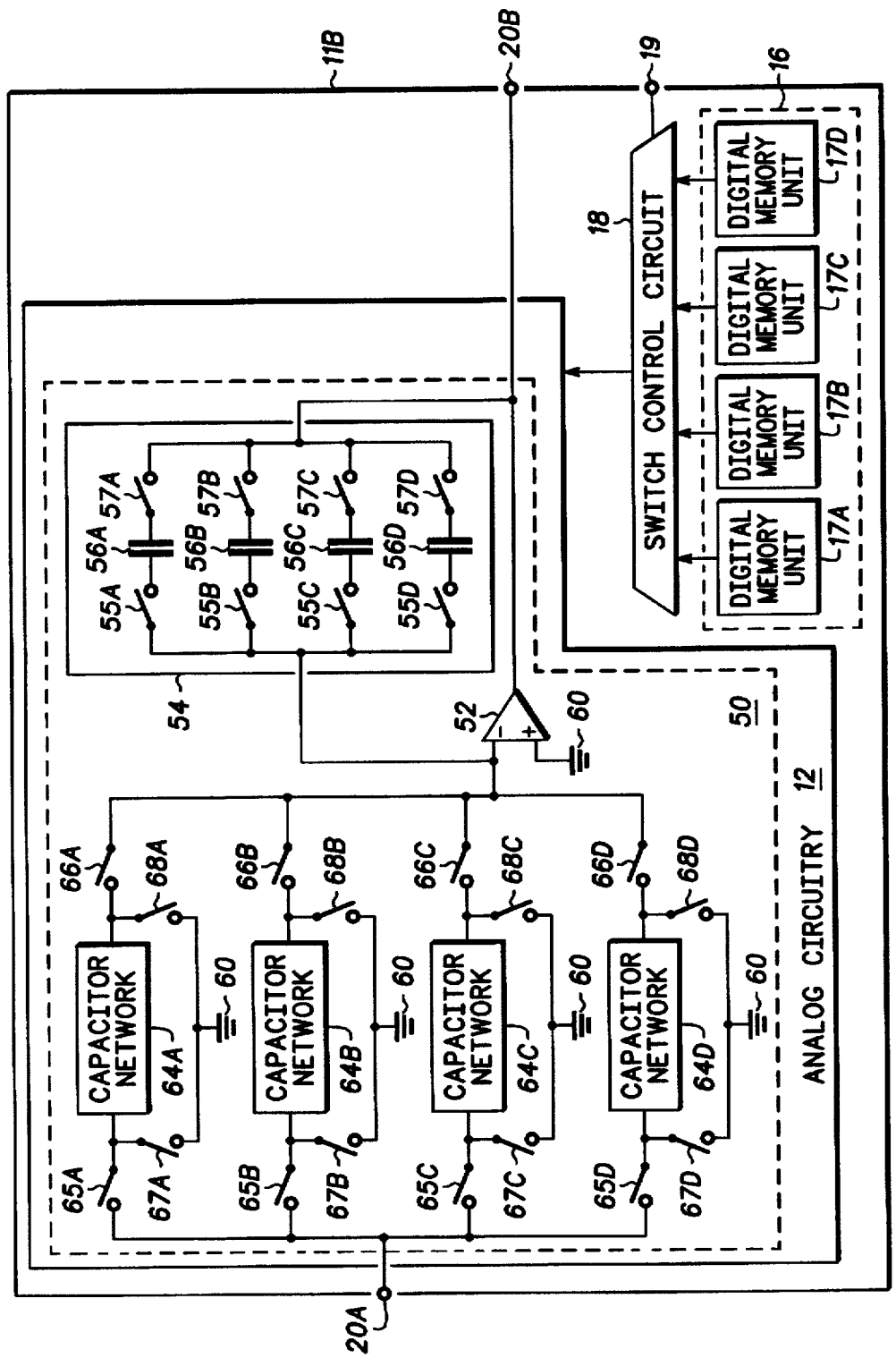
FIG. 5 is a block diagram of a cell in the programmable analog array of FIG. 1 configured as a switched capacitor integrator.

FIG. 5 is a block diagram of a cell 11B in array 11 of FIG. 1 configured as a switched capacitor integrator 50. Cell 11B can be any cell in array 11 of FIG. 1. Switched capacitor integrator 50 is configured from analog circuitry 12 of cell 11B in accordance with the cell configuration data and the interconnection data. It should be understood that the same reference numerals are used in the figures to denote the same elements.

Switched capacitor integrator 50 includes an operational amplifier 52 and capacitor networks 54, 64A, 64B, 64C, and 64D. The first terminals of capacitor networks 64A, 64B, 64C, and 64D are coupled to a node 20A via switches 65A, 65B, 65C, and 65D, respectively. Node 20A is coupled for receiving an input signal of cell 11B. The second terminals of capacitor networks 64A, 64B, 64C, and 64D are coupled to an inverting input of operational amplifier 52 via switches 66A, 66B, 66C, and 66D, respectively. In addition, the first terminals of capacitor networks 64A, 64B, 64C, and 64D are coupled a node 60 via switches 67A, 67B, 67C, and 67D, respectively. Likewise, the second terminals of capacitor networks 64A, 64B, 64C, and 64D are coupled to node 60 via switches 68A, 68B, 68C, and 68D, respectively. Preferably, node 60 is coupled to ground. The inverting input of operational amplifier 52 is also coupled to an output of operational amplifier 52 via capacitor network 54. A non-inverting input of operational amplifier 52 is connected to ground via node 60. The output of operational amplifier 52 is connected to node 20B of cell 11B for transmitting an output signal of cell 11B.

Capacitor network 54 is partitioned into four sections using the method described with reference to FIGS. 3 and 4. Each section is represented by a capacitor having a first electrode and a second electrode. The first section is represented by a capacitor 56A, whose two electrodes are coupled to the two corresponding terminals of capacitor network 54 via switches 55A and 57A. The second section is represented by a capacitor 56B, whose two electrodes are coupled to the two corresponding terminals of capacitor network 54 via switches 55B and 57B. The third section is represented by a capacitor 56C, whose two electrodes are coupled to the two corresponding terminals of capacitor network 54 via switches 55C and 57C. The fourth section is represented by a capacitor 56D, whose two electrodes are coupled to the two corresponding terminals of capacitor network 54 via switches 55D and 57D.

The switches in analog circuitry 12 as well as capacitor networks 54, 64A, 64B, 64C, and 64D are controlled by switch control circuit 18. Switch control circuit 18 receives a clock signal at node 19 of cell 11B and controls the switches in analog circuitry 12 and capacitor networks 54, 64A, 64B, 64C, and 64D in accordance with the cell configuration data stored in digital storage element 16 and the phase of the clock signal. As the phase of the clock signal at node 19 changes, switch control circuit 18 reconfigures the circuits within analog circuitry 12 using the cell configuration data stored in digital memory units 17A, 17B, 17C, and 17D, thereby changing the characteristics, e.g., the gain and time constant, of switched capacitor integrator 50.

Figure 6:
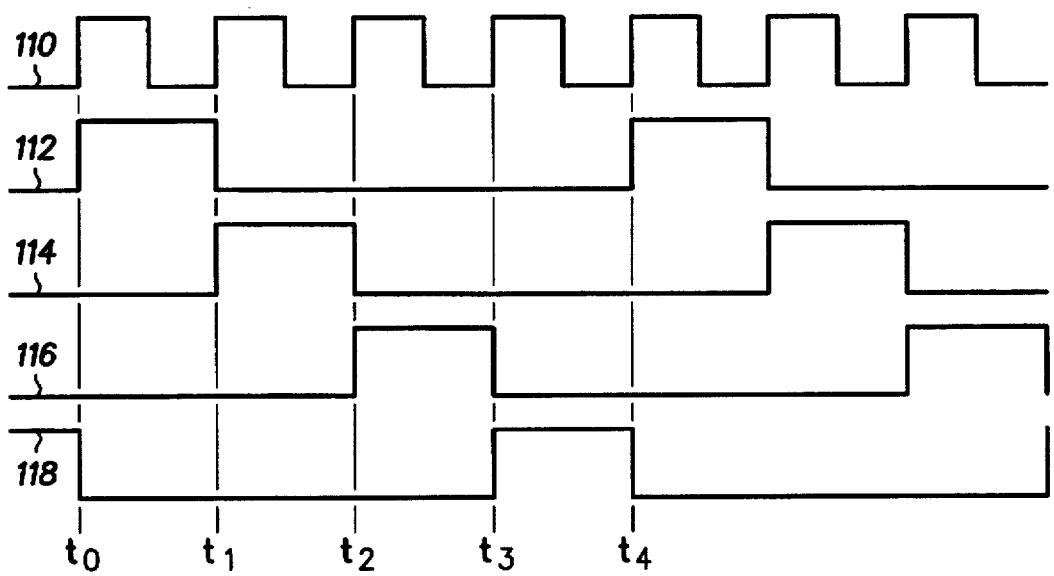
FIG. 6 is a timing diagram of signals used to configure the switched capacitor integrator of FIG. 5.

FIG. 6 is a timing diagram 100 of signals used to configure switched capacitor integrator 50 of FIG. 3. A clock signal 110 having a period equal to the time difference between time $t_0$ and time $t_1$ is transmitted to cell 11B of array 11. Switch control circuit 18 receives clock signal 110 and generates control signals 112, 114, 116, and 118. The periods of control signals 112, 114, 116, and 118 are equal to the time difference between time $t_0$ and time $t_4$, which is four times the period of clock signal 110. The circuits within analog circuitry 12 are periodically and sequentially configured to realize different circuit functions in accordance with the cell configuration data stored in digital memory units 17A–17D and the phases of control signals 112, 114, 116, and 118.

Control signals 112, 114, 116, and 118 selectively enables different digital memory units 17A–17D in digital storage element 16 to provide the cell configuration data to configure analog circuitry 12 to realize different circuit functions at different times. It should be understood that control signals 112, 114, 116, and 118 are not limited to being generated in cell 11B of array 11 using clock signal 110. In an alternative embodiment of the present invention, control signal 112, 114, 116, and 118 are transmitted to cell 11B of array 11 from a source external to array 11 of cells.

In a time interval from time $t_0$ to time $t_1$, control signal 112 is at a first voltage level, e.g., a logic high voltage level, and control signals 114, 116, and 118 are at a second voltage level, e.g., a logic low voltage level. Switch control circuit 18 uses the cell configuration data stored in digital memory unit 17A to configure the circuits within analog circuitry 12. In accordance with the cell configuration data, switch control circuit 18 turns on switches 65A, 66A, 67B, and 68B, and turns off switches 67A, 68A, 65B, 66B, and all switches coupled to capacitor networks 64C and 64D. In addition, switch control circuit 18 turns on switches 55A and 57A, and turns off switches 55B, 57B, 55C, 57C, 55D, and 57D, thereby coupling the two electrodes of capacitor 56A to the two corresponding terminals of capacitor network 54. Therefore, the circuits within analog circuitry 12 of cell 11B are configured as a switched capacitor integrator having capacitor network 64A as the sampling capacitor and capacitor 56A as the integrating capacitor. Thus, switched capacitor integrator 50 has a gain determined by the capacitance of capacitor network 64A and the capacitance of the capacitor 56A.

In a time interval from time $t_1$ to time $t_2$, control signal 114 is at a logic high voltage level and control signals 112, 116, and 118 are at a logic low voltage level. Switch control circuit 18 uses the cell configuration data stored in digital memory unit 17B to configure the circuit within analog circuitry 12. In accordance with the cell configuration data, switch control circuit 18 turns on switches 65B, 66B, 67A, and 68A, and turns off switches 67B, 68B, 65A, 66A, and all switches coupled to capacitor networks 64C and 64D. In addition, switch control circuit 18 turns on switches 55B and 57B, and turns off switches 55A, 57A, 55C, 57C, 55D, and 57D, thereby coupling the two electrodes of capacitor 56B to the two corresponding terminals of capacitor network 54. Therefore, the circuits within analog circuitry 12 of cell 11B are configured as a switched capacitor integrator having capacitor network 64B as the sampling capacitor and capacitor 56B as the integrating capacitor. Thus, switched capacitor integrator 50 has a gain determined by the capacitance of capacitor network 64B and the capacitance of the capacitor 56B. Capacitor 56A in capacitor network 54 is now isolated from operational amplifier 52 and stores the output voltage generated by operational amplifier 52 during the time interval between times $t_0$ and $t_1$.

In a time interval from time $t_2$ to time $t_3$, control signal 116 is at a logic high voltage level and control signals 112, 114, and 118 are at a logic low voltage level. Switch control circuit 18 uses the cell configuration data stored in digital memory unit 17C to configure the circuits within analog circuitry 12. In accordance with the cell configuration data, switch control circuit 18 turns on switches 65C, 66C, 67D, and 68D, and turns off switches 67C, 68C, 65D, 66D, and all switches coupled to capacitor networks 64A and 64B. In addition, switch control circuit 18 turns on switches 55C and 57C, and turns off switches 55A, 57A, 55B, 57B, 55D, and 57D, thereby coupling the two electrodes of capacitor 56C to the two corresponding terminals of capacitor network 54. Therefore, the circuits within analog circuitry 12 of cell 11B are configured as a switched capacitor integrator having capacitor network 64C as the sampling capacitor and capacitor 56C as the integrating capacitor. Thus, switched capacitor integrator 50 has a gain determined by the capacitance of capacitor network 64C and the capacitance of the capacitor 56C. Capacitors 56A and 56B in capacitor network 54 are now isolated from operational amplifier 52 and store the output voltages generated by operational amplifier 52 during the time intervals between times $t_0$ and $t_1$ and between times $t_1$ and $t_2$, respectively.

In a time interval from time $t_3$ to time $t_4$, control signal 118 is at a logic high voltage level and control signals 112, 114, and 116 are at a logic low voltage level. Switch control circuit 18 uses the cell configuration data stored in digital memory unit 17D to configure the circuits within analog circuitry 12. In accordance with the cell configuration data, switch control circuit 18 turns on switches 65D, 66D, 67C, and 68C, and turns off switches 67D, 68D, 65C, 66C, and all switches coupled to capacitor networks 64A and 64B. In addition, switch control circuit 18 turns on switches 55D and 57D, and turns off switches 55A, 57A, 55B, 57B, 55C, and 57C, thereby coupling the two electrodes of capacitor 56D to the two corresponding terminals of capacitor network 54. Therefore, the circuits within analog circuitry 12 of cell 11B are configured as a switched capacitor integrator having capacitor network 64D as the sampling capacitor and capacitor 56D as the integrating capacitor. Thus, switched capacitor integrator 50 has a gain determined by the capacitance of capacitor network 64D and the capacitance of the capacitor 56D. Capacitors 56A, 56B, and 56C in capacitor network 54 are now isolated from operational amplifier 52 and store the output voltages generated by operational amplifier 52 during the time intervals between times $t_0$ and $t_1$, between times $t_1$ and $t_2$, and between times $t_2$ and $t_3$, respectively.

At time $t_4$, cell 11B repeats the process that occurs between times $t_0$ and $t_4$ as described supra. During a time interval when a particular section of capacitor network 54 is coupled to the inverting input and the output of operational amplifier 52, all other sections of capacitor network 54 are isolated from operational amplifier 52. While a section of capacitor network 54 is isolated from operational amplifier 52, the section stores the output voltage generated by operational amplifier 52 during a previous time interval when the section is coupled to operational amplifier 52. Therefore, capacitor network 54 also functions as analog storage element for analog circuitry 12. Each capacitor 56A–56D in capacitor network 54 functions as an analog memory unit in the analog storage element.

It should be understood that, in the present invention, switch control circuit 18 is not limited to using the cell configuration data stored in digital memory units 17A–17D to configure the circuits within analog circuitry 12 in the same chronological order as that described with reference to FIG. 6. It should also be understood that the relation between the selection of capacitor networks 64A–64D and the selection of capacitors 56A–56D is not limited to that described with reference to FIG. 6. For example, during a phase of the clock signal, switch control circuit 18 may select capacitor network 64B as the sampling capacitor of switched capacitor integrator 50 and select capacitor 56D in capacitor network 54 as the integrating capacitor of switched capacitor integrator 50. Furthermore, more than one capacitor network, e.g., capacitor networks 64B and 64D, may be selected simultaneously and coupled in parallel with each other to serve as the sampling capacitor of switched capacitor integrator 50. Likewise, more than one capacitor in capacitor network 54, e.g., capacitors 56A and 56C, may be selected simultaneously and coupled in parallel with each other to serve as the integrating capacitor of switched capacitor integrator 50.

Figure 7:
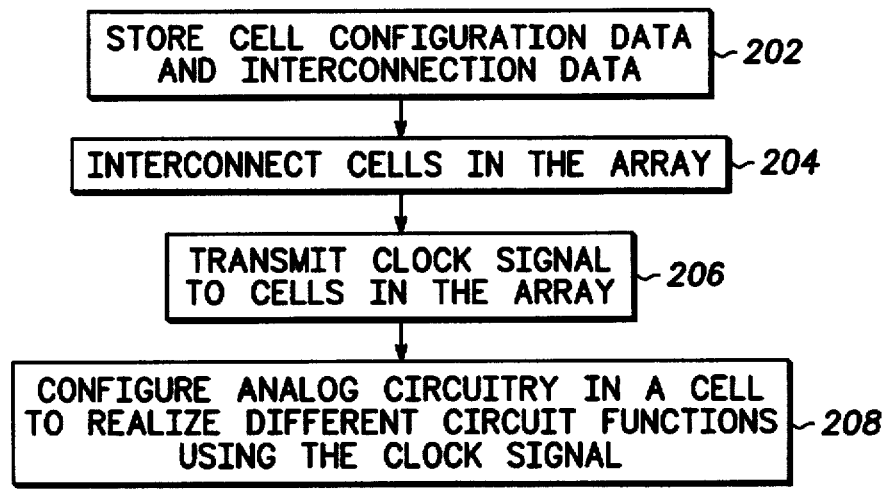
FIG. 7 is a flow chart of a method for dynamically configuring the programmable analog array of FIG. 1 in accordance with an embodiment of the present invention.

FIG. 7 is a glow chart 200 of a method for dynamically configuring a programmable analog array such as programmable analog array 10 of FIG. 1. The programmable analog array comprises an input/output circuit and an array of cells. The array of cells are arranged in rows and columns. Analog circuitry, a switch control circuit, and a digital storage element are formed in each cell of the array.

In step 202, cell configuration data and interconnection data for realizing a set of circuit functions are stored in the digital storage element. The cell configuration data and interconnection data can be updated from an external source in order to implement new circuits within the array of cells. The cell configuration data and interconnection data are transmitted to the digital storage element of a cell in the programmable analog array using, for example, two programming shift registers and a control circuit. One programming shift register provides a row coordinate reference signal and the other programming shift register provides a column coordinate reference signal. The row and column coordinate reference signals allow each cell in the programmable analog array to be individually accessed and configured.

In step 204, interconnection between different cells in the array is established via an interconnection network in accordance with the interconnection data. The configuration of each cell in the array and the interconnection among different cells in the array determine the functionality of the programmable analog array.

In step 206, a clock signal is transmitted to the switch control circuit. The switch control circuit uses the clock signal to generate a set of control signals, which configure the analog circuitry (step 208) to realize different circuit functions in response to different phases of the clock signal. For example, the digital storage element is partitioned into a set of digital memory units, and each digital memory unit stores the data for a particular circuit function. For each phase of the clock signal, the analog circuitry is configured in accordance with the data stored in a corresponding digital memory unit. While the analog circuitry is configured to realize a circuit function during a phase of the clock signal, the analog signals, such as voltages, generated by the analog circuitry during previous phases of the clock signal are stored in an analog storage element. The analog storage element is partitioned into a set of analog memory units which store the analog signals generated by the analog circuitry during corresponding phases of the clock signal.

By now it should be appreciated that a programmable analog array and a method for dynamically configuring the programmable analog array to increase the functionality of the programmable analog array have been provided. In accordance with the present invention, a switch control circuit receives a clock signal and configures analog circuitry of the cells in the programmable analog array to realize different circuit functions at different phases of the clock signal, thereby effectively increasing the functionality of each cell in the array. While the cell executes an operation during a phase of the clock signal, the analog signals generated in previous phases of the clock signal are stored in an analog storage element. The analog storage element is built from a portion of capacitors in the cell, thereby minimizing the size and manufacturing cost of the semiconductor chip.

We claim:

1. A programmable analog array, comprising:
   an array of cells, wherein a first cell in the array of cells includes analog circuitry which is configurable to realize a plurality of circuit functions, and a switch control circuit which periodically configures the analog circuitry to realize a first circuit function of the plurality of circuit functions and reconfigures the analog circuitry to realize a second circuit function of the plurality of circuit functions;
   an interconnection network coupled to the array of cells, wherein the interconnection network allows an interconnection of the first cell in the array of cells with a second cell in the array of cells; and
   an access circuit which selectively accesses the first cell in the array of cells, transmits cell configuration data for the first circuit function and the second circuit function to the first cell, and transmits interconnection data to the interconnection network.

2. The programmable analog array of claim 1, wherein the first cell in the array of cells is coupled for receiving a clock signal, and wherein a control signal having a plurality of phases is generated using the clock signal, the switch control circuit of the first cell configures the analog circuitry of the first cell to realize the first circuit function upon receiving a first phase of the plurality of phases of the control signal and reconfigures the analog circuitry of the first cell to realize the second circuit function upon receiving a second phase of the plurality of phases of the control signal.

3. The programmable analog array of claim 1, wherein the first cell in the array of cells is coupled for receiving a control signal having a plurality of phases, the switch control circuit of the first cell configures the analog circuitry of the first cell to realize the first circuit function upon receiving a first phase of the plurality of phases of the control signal and reconfigures the analog circuitry of the first cell to realize the second circuit function upon receiving a second phase of the plurality of phases of the control signal.

4. The programmable analog array of claim 1, wherein the first cell in the array of cells further includes a digital storage element which stores the cell configuration data for the first circuit function and the second circuit function.

5. The programmable analog array of claim 4, wherein the digital storage element includes a plurality of digital memory units, and wherein each digital memory unit of the plurality of digital memory units stores data for configuring the analog circuitry to realize a circuit function of the plurality of circuit functions.

6. The programmable analog array of claim 1, wherein the analog circuitry includes a capacitor network.

7. The programmable analog array of claim 6, wherein the first cell in the array of cells further includes an analog storage element which stores an analog signal generated by the analog circuitry of the first cell.

8. The programmable analog array of claim 7, wherein a portion of the capacitor network in the analog circuitry serves as the analog storage element.

9. The programmable analog array of claim 7, wherein the analog storage element includes a first analog memory unit for storing the analog signal generated by the analog circuitry configured to realize the first circuit function, and a second analog memory unit for storing the analog signal generated by the analog circuitry configured to realize the second circuit function.

10. A programmable analog array, comprising:
    an array of cells, wherein a first cell in the array of cells includes:
       analog circuitry;
       a digital storage element which stores cell configuration data for a plurality of circuit functions;
       a switch control circuit which periodically and sequentially configures the analog circuitry to realize each circuit function of the plurality of circuit functions in accordance with the cell configuration data stored in the digital storage element; and
       an analog storage element which stores an analog signal generated by the analog circuitry;
    an interconnection network coupled to the array of cells, wherein the interconnection network allows an interconnection of the first cell in the array of cells with a second cell in the array of cells; and
    an access circuit which selectively accesses the first cell in the array of cells, transmits the cell configuration data to the first cell, and transmits interconnection data to the interconnection network.

11. The programmable analog array of claim 10, wherein the first cell in the array of cells is coupled for receiving a clock signal, and wherein a control signal having a plurality of phases is generated using the clock signal, the switch control circuit configures the analog circuitry to realize a first circuit function of the plurality of circuit functions upon receiving a first phase of the plurality of phases of the control signal, and reconfigures the analog circuitry to realize a second circuit function of the plurality of circuit functions upon receiving a second phase of the plurality of phases of the control signal.

12. The programmable analog array of claim 10, wherein the analog storage element includes a plurality of analog memory units, each analog memory unit storing an analog signal generated by the analog circuitry while the analog circuitry is configured to realize a corresponding circuit function of the plurality of circuit functions.

13. The programmable analog array of claim 10, wherein the analog circuitry of the first cell in the array of cells includes a capacitor network.

14. The programmable analog array of claim 13, wherein a portion of the capacitor network serves as the analog storage element.

15. A method for configuring a programmable analog array, comprising the steps of:
    storing cell configuration data for a plurality of circuit functions in a digital storage element of a first cell in the programmable analog array;
    transmitting a clock signal to the first cell;
    configuring analog circuitry in the first cell to realize a first circuit function of the plurality of circuit functions for a first time interval; and configuring the analog circuitry in the first cell to realize a second circuit function of the plurality of circuit functions for a second time interval.

16. The method for configuring a programmable analog array as claimed in claim 15, further comprising the step of coupling the first cell to a second cell in the programmable analog array.

17. The method for configuring a programmable analog array as claimed in claim 15, further comprising the steps of:

storing an analog signal generated by the analog circuitry of the first cell in the programmable analog array while the analog circuitry is configured to realize the first circuit function; and storing an analog signal generated by the analog circuitry of the first cell in the programmable analog array while the analog circuitry is configured to realize the second circuit function.

18. The method for configuring a programmable analog array as claimed in claim 17, wherein the step of storing an analog signal further includes the step of forming an analog storage element of the first cell using a capacitor network in the analog circuitry of the first cell.

19. The method for configuring a programmable analog array as claimed in claim 18, wherein the step of forming an analog storage element further includes the step of partitioning the capacitor network into a plurality of sections.

20. The method for configuring a programmable analog array as claimed in claim 19, wherein the step of storing an analog signal generated by the analog circuitry of the first cell in the programmable analog array while the analog circuitry is configured to realize the first circuit function further includes the step of storing the analog signal in a first section of the plurality of sections of the capacitor network.

* * * * *